(12) United States Patent
Boulant

(10) Patent No.: US 8,674,693 B2
(45) Date of Patent: Mar. 18, 2014

(54) METHOD AND APPARATUS FOR CORRECTING $B_1$-INHOMOGENEITIES IN NUCLEAR MAGNETIC RESONANCE IMAGING

(75) Inventor: Nicolas Boulant, Giflyvette (FR)

(73) Assignees: Commissariat a l'Energie Atomique et aux Energies Alternatives, Paris (FR); Siemens Aktiengesellschaft, Munich (DE)

( * ) Notice: Subject to any disclaimer, the term of this patent is extended or adjusted under 35 U.S.C. 154(b) by 913 days.

(21) Appl. No.: 12/739,443

(22) PCT Filed: Oct. 26, 2007

(86) PCT No.: PCT/IB2007/004256
§ 371 (c)(1),
(2), (4) Date: Jun. 16, 2010

(87) PCT Pub. No.: WO2009/053770
PCT Pub. Date: Apr. 30, 2009

(65) Prior Publication Data
US 2010/0301859 A1  Dec. 2, 2010

(51) Int. Cl.
*G01R 33/48* (2006.01)
(52) U.S. Cl.
USPC ............................ 324/309; 324/307; 600/410
(58) Field of Classification Search
USPC .................................. 324/300–322; 600/410
See application file for complete search history.

(56) References Cited

U.S. PATENT DOCUMENTS 5,019,784 A  5/1991 Garwood et al.
6,268,728 B1 * 7/2001 Morrell .......................... 324/307

(Continued)

FOREIGN PATENT DOCUMENTS

DE   10 2006 017 439 B3   10/2007
WO   WO 2005/088329 A1    9/2005

OTHER PUBLICATIONS

Fortunato et al.; "Design of Strongly Modulating Pulses to Implement Precise Effective Hamiltonians for Quantum Information Processing"; Feb. 12, 2002; Journal of Chemical Physics; vol. 116, Issue 17; pp. 1-8.*

(Continued)

*Primary Examiner* — Melissa Koval
*Assistant Examiner* — Rishi Patel
(74) *Attorney, Agent, or Firm* — Alston & Bird LLP

(57) ABSTRACT

A method of performing nuclear magnetic resonance imaging of a body (B), comprising: immerging said body in a static magnetic field B0 for aligning nuclear spins along a magnetization axis; exposing it to a transverse radio-frequency pulsed field Bi for flipping said nuclear spins by a predetermined angle; and detecting a signal emitted by flipped nuclear spins; the method being characterized in that it comprises the preliminary steps of: (i) determining a statistical distribution of the amplitude of said radio-frequency pulsed field within a volume of said body; and (ii) computing a set of optimal parameters of a composite radio-frequency pulsed field for jointly minimizing the dispersion of the spin flip angles distribution within said volume of the body, due to B1 and possibly B0 inhomogeneities, and the errors between the actual spin flip angles and their predetermined target value, wherein said radio-frequency pulsed field consists of a train of elementary pulses having a constant frequency and amplitude, and a continuous phase, and said parameters comprise: the number of said elementary pulses, as well as the duration, amplitude, frequency and relative initial phase of each of them.

9 Claims, 2 Drawing Sheets

(56) References Cited

U.S. PATENT DOCUMENTS

| | | | |
|---|---|---|---|
| 6,828,790 | B2 | 12/2004 | Katscher et al. |
| 6,975,114 | B1 | 12/2005 | Ledden |
| 7,075,302 | B2 | 7/2006 | Zhu |
| 7,281,113 | B2 | 10/2007 | Fujita et al. |
| 2007/0057673 | A1 | 3/2007 | Nayak et al. |
| 2012/0105060 | A1* | 5/2012 | Boulant ........................ 324/309 |

OTHER PUBLICATIONS

Schulte et al.; "Design of broadband RF pulses with polynomial-phase response"; Feb. 4, 2007; Journal of Magnetic Resonance; vol. 186, Issue 2; pp. 167-175.*

Boulant, N. et al., *Strongly Modulating Pulses: a New Method for Counteracting RF Inhomogeneity at High Fields*, Proc. Intl. soc. Mag. Reson. Med., 16, (2008), p. 232.

Collins, C. M. et al., *Array-Optimized Composite Pulse for Excellent Whole-Brain Homogeneity in High-Field MRI*, Magnetic Resonance in Medicine, 57, (2007), pp. 470-474.

Deichmann, R., et al., *RF Inhomogeneity Compensation in Structural Brain Imaging*, Magnetic Resonance in medicine, 47, (2002), pp. 398-402.

Geen, H. et al., *Band-Selective Radiofrequency Pulses*, Journal of Magnetic Resonance, 93, (1991), pp. 93-141.

Pravia, M. A. et al., *Robust Control of Quantum Information*, Journal of Chemical Physics, vol. 119, No. 19, (2003), pp. 9993-10001.

Zhang, Z. et al., *Reduction of Tramsmitter $B_1$ Inhomogeneity With Transmit SENSE Slice-Select Pulses*, Magnetic Resonance in Medicine, 57, (2007), pp. 842-847.

International Search Report for Application No. PCT/IB2007/004256 mailed Aug. 11, 2008.

Li, J. et al., *Control of Inhomogeneous Quantum Ensembles*, Physical Review A, vol. 73 (2002).

Yarnykh, V. L., *Actual Flip-Angle Imaging in the Pulsed Steady State: A Method for Rapid Three Dimensional mapping of the Transmitted Radiofrequency Field*, Magnet Resonance in Medicine, vol. 57 (2007) pp. 192-200.

\* cited by examiner

METHOD AND APPARATUS FOR CORRECTING $B_1$-INHOMOGENEITIES IN NUCLEAR MAGNETIC RESONANCE IMAGING

FIELD OF THE INVENTION

The invention relates to a method for correcting the radio-frequency pulsed field (or "$B_1$") inhomogeneities in nuclear magnetic resonance (NMR), and more particularly in nuclear magnetic resonance imaging (MRI).

The invention also relates to an apparatus, or "scanner", adapted for carrying out such a method.

BACKGROUND

Magnetic resonance imaging (MRI) is a very powerful tool in research and diagnostics. It comprises immersing a body in a static magnetic field $B_0$ for aligning nuclear spins thereof; exposing it to a transverse radio-frequency pulsed field $B_1$ at a resonance frequency known as the "Larmor frequency" for flipping said nuclear spins by a predetermined angle; and detecting a signal emitted by flipped nuclear spins, from which an image of the body can be reconstructed.

There is a trend to move towards higher and higher static magnetic fields in order to improve the spatial resolution of MRI. For example, magnetic fields of 1.5 T (Tesla) are currently used in clinical practice, 3 T is the highest field used in commercial apparatuses and research systems can operate at more than 7 T. However, as the strength of the static magnetic field increases, the wavelength of the radio-frequency pulsed field decreases and its amplitude distribution within the body to be imaged becomes less homogeneous.

Radio-frequency pulsed field inhomogeneities already introduce significant artifacts at 3 T. At 7 T, the Larmor frequency of protons is about 300 MHz, which corresponds to a wavelength around 14 cm in the human brain, i.e. a size comparable to that of a human head. In these conditions, the radio-frequency pulsed field $B_1$ is so inhomogeneous that images e.g. of a human brain obtained with standard techniques can become very difficult to interpret.

The radio-frequency (or "$B_1$") inhomogeneity problem is so important that it could hinder further developments of high-resolution MRI.

Moreover, the static magnetic field $B_0$ also shows a certain spatial inhomogeneity, which in turn induces artifacts. This effect is also worsened by the current trend of increasing the strength of the magnetic field.

A number of techniques have been developed in order to deal with these inhomogeneity problems.

A first possibility ("RF shimming" technique) consists in using a plurality of antennas to generate the radio-frequency pulsed field $B_1$; by adjusting the amplitude and initial phase on each antenna, it is possible to homogenize the RF field by interference. This technique is disclosed e.g. by document U.S. Pat. No. 7,281,113. Its main drawbacks are the smallness of the volume over which the radio-frequency field is effectively homogenized, the added hardware complexity and the large energy deposited in the body.

The so-called "Transmit-SENSE" technique also uses a plurality of antennas. However, this technique does not aim at homogenizing the instantaneous radio-frequency field, but only the resulting spin flip angle.

In other words, the field may stay inhomogeneous at some given instant, but the temporal variation of the radio-frequency field, thanks to the additional use of magnetic field gradients, finally yields the desired excitation pattern. By writing the solution of the Bloch equation in the linear regime, searching for a solution (phase and amplitude) on each antenna is equivalent to a linear inverse problem. Nevertheless, this method has several disadvantages. The first one is the initial approximation used in the calculation (small flip angle approximation, allowing a linear analysis), leading to a deterioration of the results at higher flip angles. Second, like for the "RF shimming" technique, long measurements of the radio-frequency profile for each antenna need to be performed on each patient before actually being able to compute a solution and obtain a uniform excitation. Third, the numerical problem is of large size and requires a non-negligible calculation time, on the patient exam scale. All these factors make the exam for a patient much lengthier. Finally, there is, like for "RF-shimming", added hardware complexity.

The "Transmit-SENSE" technique is described e.g. by documents U.S. Pat. Nos. 7,075,302 and 6,828,790.

A completely different approach to the inhomogeneity problems is to use "adiabatic pulses", i.e. pulses whose amplitude and phase are continuously varied, slowly enough so that the spins, if initially along the effective magnetic field, evolve while staying aligned (or anti-aligned) with that same effective magnetic field. A rotation of the spins can therefore be implemented in a robust way since it is mostly the rate of variation of the field that matters, rather than its amplitude. Like for "Transmit-SENSE", but unlike for "RE-shimming" techniques, adiabatic pulses can also deal with static magnetic field ($B_0$) inhomogeneities. The adiabatic technique is described e.g. by document U.S. Pat. No. 5,019,784.

However, good homogenization performances require pulses which are either too long, or too powerful, or both, and can therefore turn out to be harmful for a patient. Adiabatic pulses whose duration and power are maintained within practical and safe limits show less than satisfying homogenizing properties.

SUMMARY

An object of the present invention is to provide a new MRI technique efficiently compensating for $B_1$, and preferably also $B_0$, inhomogeneities, without the drawbacks of the prior art techniques.

The method of the invention is based on the use of piecewise constant frequency modulated composite radio-frequency pulses, initially developed to provide good coherent control for a system of multiple coupled spins for Nuclear Magnetic Resonance Quantum Information Processing: see:

"Design of strongly modulating pulses to implement precise effective Hamiltonians for quantum information processing", E. M. Fortunato, M. A. Pravia, N. Boulant, G. Teklemariam, T. F. Havel and D. G. Cory, Journal of Chemical Physics, vol. 116, pp 7599-7606 (2002); and "Robust control of quantum information", M. A. Pravia, N. Boulant, J. Emerson, A. Farid, E. Fortunato, T. F. Havel, R. Martinez, D. G. Cory, Journal Chemical Physics 119, pp 9993-10001 (2003).

Unlike adiabatic pulses, the pulses of the invention have a piecewise-constant amplitude and frequency.

As it will be shown hereafter, the use of piecewise constant frequency modulated composite radio-frequency pulses allows achieving a remarkably uniform excitation (i.e. spin flip angle) even in the presence of significant $B_1$ and/or $B_0$ inhomogeneities. Their design requires a comparably short computation time and their length and power can be kept below harmful levels.

More precisely, an object of the present invention is a method of performing nuclear magnetic resonance imaging of a body, comprising: immerging said body in a static magnetic field for aligning nuclear spins along a magnetization axis; exposing it to a transverse radio-frequency pulsed field for flipping said nuclear spins by a predetermined angle; and detecting a signal emitted by flipped nuclear spins; the method being characterized in that it comprises the preliminary steps of: determining a statistical distribution of the amplitude of said radio-frequency pulsed field within a volume of said body; and computing a set of optimal parameters of a composite radio-frequency pulsed field for jointly minimizing the dispersion of the spin flip angles distribution within said volume of the body, and the errors between the actual spin-flip angles and their predetermined target value, wherein said radio-frequency pulsed field consists of a train of elementary pulses having a constant frequency and amplitude, and a continuous phase; and said parameters comprise: the number of said elementary pulses, as well as the duration, amplitude, frequency and relative initial phase of each of them.

According to particular embodiments of the invention:

Said step of determining a statistical distribution of the amplitude of said radio-frequency pulsed field within a volume of said body can comprise constructing an histogram of the values taken by the amplitude of said radio-frequency pulsed field within said volume of the body.

The method can further comprise a step of determining a statistical distribution of the amplitude of said static magnetic field along said magnetization axis within said volume of the body, and said step of computing a set of optimal parameters of said composite radio-frequency pulsed field can be performed by taking into account said statistical distribution of the amplitude of said static magnetic field.

In this case, said step of determining a statistical distribution of the amplitude of said radio-frequency pulsed field within a volume of said body can comprise constructing a bi-dimensional histogram of the values taken by the amplitude of said radio-frequency pulsed field and of said static magnetic field along said magnetization axis within said volume of the body.

Said step of computing a set of optimal parameters of said composite radio-frequency pulsed field can comprise: predetermining a minimal number of elementary pulses; computing optimal values for the durations, amplitudes, frequencies and relative initial phases of said elementary pulses, and evaluating the corresponding dispersion of the spin flip angles distribution and errors between the actual spin flip angles and their predetermined target value; if at least one between the dispersion of the spin-flip angles distribution within said volume of the body, and the errors between the actual spin-flip angles and their predetermined target value, exceeds a predetermined threshold, and if the number of elementary pulses is less than a predetermined maximum, increasing said number of elementary pulses and repeating the optimization sub-step.

Said step of computing a set of optimal parameters of said composite radio-frequency pulsed field can be performed by taking into account a penalty function depending on at least one of: the duration of the composite radio-frequency pulsed field, its peak power, its energy, its maximum frequency and its specific absorption rate.

Said step of computing a set of optimal parameters of said composite radio-frequency pulsed field can be implemented by using a genetic algorithm combined with a direct search method.

Said step of determining a statistical distribution of the amplitude of said radio-frequency pulsed field within a volume of said body can comprise: measuring the dispersion of the spin flip angles distribution within said volume of the body; and deducing a statistical distribution of the amplitude of said radio-frequency pulsed field.

Another object of the present invention is a magnetic resonance imaging scanner comprising: a magnet for generating a static magnetic field for aligning nuclear spins of a body to be imaged along a magnetization axis; means for generating a transverse radio-frequency pulsed field, and for directing said radio-frequency pulsed field toward said body in order to flip said nuclear spins by a predetermined angle; and means for detecting a signal emitted by flipped nuclear spins within said body; characterized in that said means for generating a radio-frequency pulsed field comprise computing means for carrying out a method as described above.

BRIEF DESCRIPTION OF THE DRAWINGS

Additional features and advantages of the present invention will become apparent from the subsequent description, taken in conjunction with the accompanying drawings, which show.

DETAILED DESCRIPTION

Figure 1A:
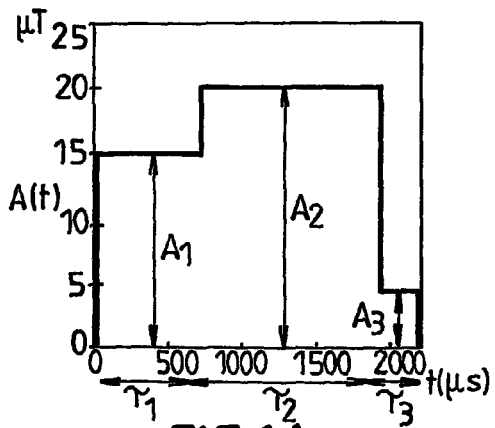
FIGS. 1A and 1B, the time-varying amplitude and phase of a radio-frequency pulsed field to be used in a method according to the invention.
Figure 1B:
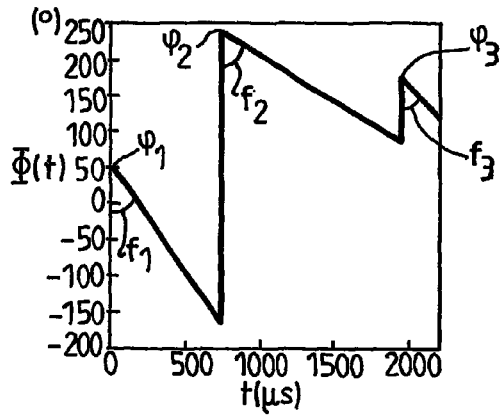

A piecewise constant frequency modulated composite radio-frequency pulse consists of a train of N elementary radio-frequency pulses of duration $\tau_i$, having a constant angular frequency $\omega_i$ and amplitude $A_i$, and a continuous phase $\Phi_i(t)=\omega_i \cdot t+\phi_i$, with $i=1-N$. FIGS. 1A and 1B represent the time-dependent amplitude and phase of a composite radio-frequency pulse composed by $N=3$ elementary pulses.

Such a pulse is completely defined by a set of 4N parameters $(\tau_i, A_i, \omega_i, \phi_i)$ with $i=1-N$. The method of the invention comprises determining the number N of elementary pulses and the corresponding set of 4N parameters in order to obtain a relatively uniform spin flip angle despite the unavoidable $B_0$ and $B_1$ inhomogeneities.

In conventional NMR, $B_1$ takes the form of a square pulse with a constant frequency and a linear-varying phase. In these conditions, and at resonance, the flip angle of the spins (FA) is simply proportional to the field amplitude and to the pulse duration. For a time-varying pulse amplitude, but at resonance and without phase discontinuities, the FA is proportional to the integral of $B_1(t)$ with respect to time. Therefore, $B_1$ inhomogeneities are directly translated into FA inhomogeneities. This is no longer true when the phase of the radio frequency pulsed field varies; for a theoretical explication of this effect, see the paper "Control of inhomogeneous quantum ensembles", by. Jr-Shin Li and Navin Khaneja, Physical Review A, vol. 73, 030302 (2002).

The prior-art adiabatic pulse technique and the method of the invention were inspired from this observation. However, the invention is advantageous over the adiabatic technique for at least two reasons:

the parameterization of the invented pulses allows one to obtain an effective homogenization of the FA over the volume of the body to be imaged with less energy;

within the duration $\tau_i$ of each elementary pulse, the phase of the radio-frequency field varies linearly with time, $\Phi_i(t) = \omega_i \cdot t + \phi_i$. Therefore, an analytical solution of the Schrödinger equation for the spins exists, which allows performing calculations in a reasonable time. On the contrary, adiabatic pulses show a nonlinearly-varying phase, and therefore require in general a longer numerical resolution of the Schrödinger equation.

The Hamiltonian H of a spin ½ at a given position $\vec{r}$ under radio-frequency (RF) irradiation, in a reference frame rotating at the Larmor frequency, is (h/2π having been set equal to 1 for convenience):

$$H(\vec{r},t) = -\frac{\gamma \Delta B_0(\vec{r})}{2}\sigma_z - \frac{\gamma B_1(\vec{r})}{2}(\sigma_x \cos(\Phi(t)) + \sigma_y \sin(\Phi(t)))$$

where $B_1(\vec{r})$ is the amplitude of the radio-frequency field at point $\vec{r}$, rotating in the same direction as the spins, $\Delta B_0(\vec{r})$ is the spatial variation of the external magnetic field $B_0$ perpendicular to $B_1$, γ is the gyromagnetic ratio (in rad/T), $\sigma_{x,y,z}$ are the Pauli spin matrices, and $\Phi(t)$ is the time dependent phase of the RF field. The Larmor frequency is computed for the average value of the external magnetic field $B_0$, i.e. for $\Delta B_0 = 0$. When $\Phi(t) = \phi_0 + \omega t$, where $\phi_0$ is the initial phase, t is the time and ω the angular frequency, in the new frame rotating at ω, the Hamiltonian is time-independent so that the Schrödinger's equation can be integrated to yield the following propagator:

$$U(\vec{r},t) = e^{-i\omega\sigma_z t/2} e^{i((\omega+\gamma\Delta B_0)\sigma_z + \gamma B_1(\sigma_x \cos(\phi_0) + \sigma_y \sin(\phi_0)))t/2}$$

which is a complex matrix of dimension 2 by 2. The spin evolution can therefore be calculated in two steps: the calculation of the propagator U, which then multiplies the initial spin wavefunction; the flip angle calculation follows.

Since a piecewise constant frequency modulated composite radio-frequency pulse consists of a train of N elementary radio-frequency pulses with constant amplitude and linearly-varying phase, the corresponding propagator is simply given by the product of the N propagators of the elementary pulses:

$$U(\vec{r},t) = \prod_{k=1}^{N} e^{-i\omega_k \sigma_z \tau_k/2} e^{i((\omega_k + \gamma\Delta B_0)\sigma_z + \gamma B_{1,k}(\sigma_x \cos(\phi_k) + \sigma_y \sin(\phi_k)))\tau_k/2}$$

where the spatial variation here is introduced via $B_1$ and $\Delta B_0$. The dynamics now is rich enough to homogenize the FA and yet, its computation can be quickly performed, due to the linear dependence on time of the phase. The optimization algorithm then consists of navigating in this 4N-dimensional parameter space in a given way to find a suitable solution.

Still, computing the propagator $U(\vec{r},t)$ for all the voxels of an image of medical interest would constitute a formidable task. But, this is not necessary. An advantageous feature of the invention is that the spatial distribution of $B_1$ and $B_0$ can be replaced by their statistical distribution. Otherwise stated, the spatial distributions of $B_1$ and $B_0$ are measured, then their values are binned in a two-dimensional histogram (a one-dimensional histogram, if only $B_1$ inhomogeneities are of interest). Thus, the propagators and the corresponding spin FA only have to be computed for each bin (a few tens), and not for each voxel (hundreds of thousands, or even millions): this greatly reduces the size of the problem. At the end of the calculation, a spatial map of the FA is not available, but only a statistical distribution (a histogram) thereof: however, this distribution contains enough information for allowing optimization of the RF pulses.

Figure 2:
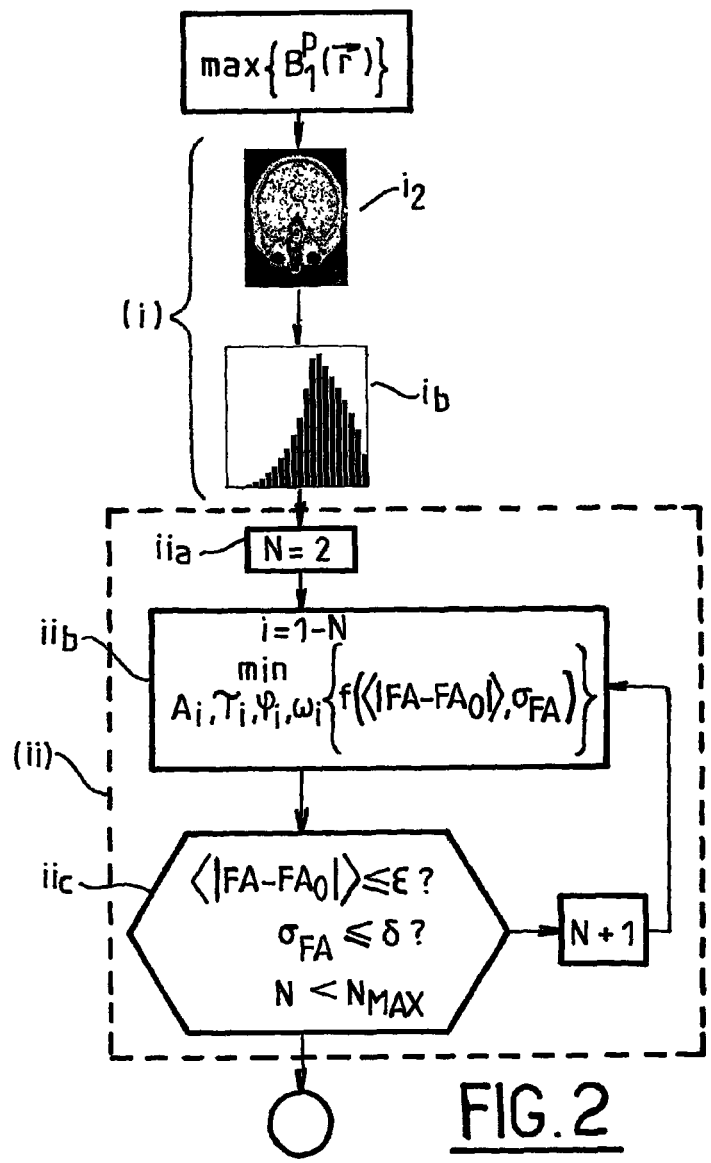
FIG. 2 a flow-chart of a method according to the invention.

The method of the invention will then be described in detail with reference to FIG. 2.

The method usually begins with a preliminary calibration step, which consists in determining the maximum value, with respect to position $\vec{r}$, of the radio-frequency pulsed field amplitude $B_1(\vec{r})$ within the volume of the body to be imaged. This allows normalization of the RF pulse amplitudes in the subsequent steps.

Figure 3A:
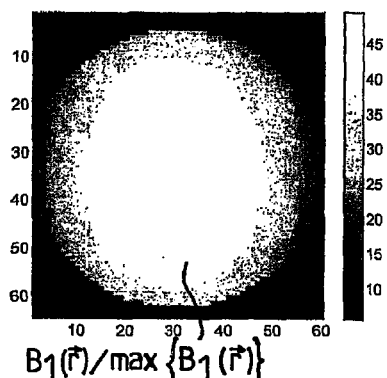
FIGS. 3A and 3B, a spatial and a statistical representation of the inhomogeneity of the radio-frequency pulsed field in a nuclear magnetic resonance experiment.

Then (step i) a statistical distribution of the normalized amplitude of the radio-frequency pulsed field within the volume of the body to be imaged is determined. FIG. 3A shows an exemplary bi-dimensional map of $B_1(\vec{r})$ in a section or slice of a body constituted by a 17 cm diameter sphere filled with distilled water, $NiSO_4$ (1.25 g/l). The $B_1$ profile measurement was performed using the method described in the paper "Actual Flip-Angle Imaging in the Pulsed Steady State: A Method for Rapid Three dimensional Mapping of the Transmitted Radiofrequency field", V. L. Yarnykh, Magnetic Resonance in Medicine, vol. 57, pp 192-200 (2007). This method actually allows measuring the flip angle for a given voxel. However, for a pulse at resonance, the flip angle is merely the integral of the pulse with respect to the time so that the $B_1$ field value can be easily calculated from that measurement. FA measurement is performed by irradiating the body by a radio-frequency pulse sequence constituted by: a first pulse adapted for flipping the spins by an angle FA (usually, a square pulse at the Larmor frequency, i.e. at resonance), a first interval $T_{R1}$ during which a first free-induction decay signal is detected in gradient-echo form, a second pulse equal to the first one and a second interval $T_{R2}$ during which a second free-induction decay signal is detected, again in gradient-echo form, the $T_{R1}$, and $T_{R2}$ interval being sufficiently shorter than the longitudinal relaxation time $T_1$ for allowing a first-order analysis. The sequence is repeated several times, in order to reconstruct first and second three-dimensional images from said first and second free-induction decay signals. Then, the ratio between said first and second reconstructed images allows determination of the FA for each voxel. The measurement of the inhomogeneities of $B_0$ along the magnetization axis can be performed using the same sequence, but by inserting additional echoes in the first interval ($T_{R1}$) to determine the phase evolution of the spins between the echoes. The nominal FA was set to 60° with a $T_R = 120$ ms (n=5) and a resolution of 2.8× 2.8×5.2 mm for a field of view of 180 mm. The execution of the sequence took 3 min 20 s. FIG. 3A has been realized by using a Siemens Trio 3T scanner with a volume coil.

As discussed above, the statistical distribution can take the form of a one-dimensional (see FIG. 3B) or of a bi-dimensional histogram depending on whether only the $B_1$ or both the $B_1$ and $B_0$ inhomogeneities are taken into account.

The second step (ii) consists in determining the optimal RF-pulse shape (i.e. the optimal set of parameters N and $\tau_i$, $A_i$, $\omega_i$, $\phi_i$ for i=1-N) in order to minimize jointly:
- the dispersion of the spin flip angles distribution within said volume of the body, e.g. the standard deviation $\sigma_{FA}$ of the FA-distribution; and
- the errors between the actual spin flip angles FA and their predetermined target value $FA_0$, e.g. the mean error of the FA: $\langle|FA-FA_0|\rangle$.

Indeed, it is not only necessary to homogenize the FA distribution, which is quantified by $\sigma_{FA}$, but to homogenize it at the right value, which is expressed by $\langle|FA-FA_0|\rangle$.

Moreover, the optimization has to be carried out under a number of constraints, which depend on both the hardware and the body to be imaged (e.g. a human patient, which cannot be exposed to an arbitrarily high RF power): overall duration of the composite pulse ($\Sigma\tau_i$), its peak power, its energy, its maximum frequency, its specific absorption rate, etc. These constraints can be expressed by a penalty function contributing to the "cost function" to be minimized by the optimization procedure, $F(\langle|FA-FA_0|\rangle, \sigma_{FA})$.

The optimization step (ii) can be carried out iteratively.

First of all ($ii_a$), a minimum number N of elementary pulses is predetermined; usually N=2;

Then ($ii_b$), optimal values for the durations $\tau_i$, amplitudes $A_i$, frequencies $\omega_i$ and relative initial phases $\phi_i$ of said elementary pulses are determined, and the corresponding values of $\langle|FA-FA_0|\rangle$ and $\sigma_{FA}$ are computed. Optimization consists in minimizing a cost function such as $F(\langle|FA-FA_0|\rangle, \sigma_{FA})=\alpha \langle|FA-FA_0|\rangle + \beta\sigma_{FA}/\langle FA\rangle + PF$, with e.g. $\alpha$=0.4 and $\beta$=1.6, PF representing the above-mentioned penalty function expressing the constraints on the composite pulses.

In general, the cost function can have several local minima and the optimization procedure can yield a "locally optimal" set of parameters, instead of a "globally optimal" one. However, in most cases such "locally optimal" parameters can be satisfactory, allowing a sufficient homogenization of the flip angle FA.

The errors between the actual spin flip angles and their predetermined target value, $\langle|FA-FA_0|\rangle$ and the dispersion of the spin-flip angles distribution $\sigma_{FA}$ are then compared to respective threshold values, $\epsilon$, $\delta$, and/or the cost function F is compared to a single threshold T ($ii_c$). If these comparisons show that the optimal composite pulse for the present value of N is not satisfactory, and if N does not exceed a predetermined maximum value ($N_{max}$), then the value of N is increased by 1 and optimization is repeated. Otherwise, image acquisition can be performed by using the (at least locally) optimal composite pulse.

In an exemplary embodiment of the invention, optimization is performed by a direct search Nelder-Mead algorithm seeded by an initial guess obtained through a genetic algorithm (single gene crossover with random mixing, 30% mutation rate, population of 200 individuals and 500 generations).

Figure 3B:
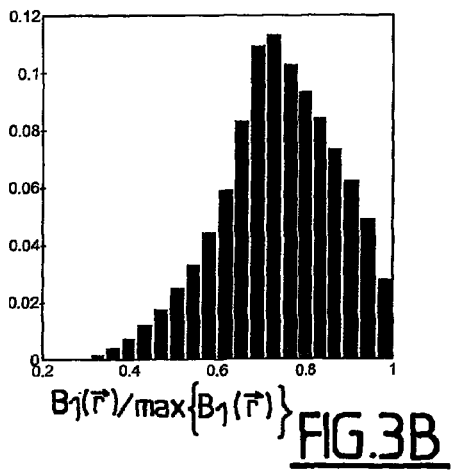
Figure 4A:
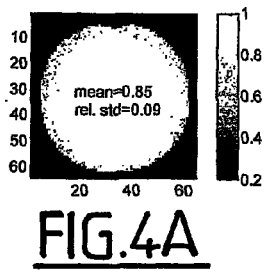
FIGS. 4A to 4F, the homogenization of the spin flip angle obtained through a method according to the invention.
Figure 4C:
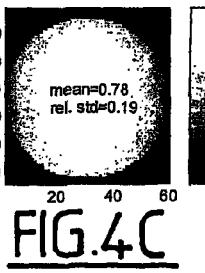
Figure 4E:
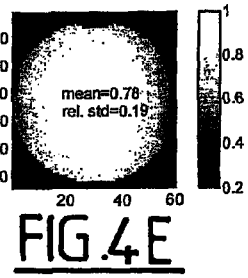
Figure 4B:
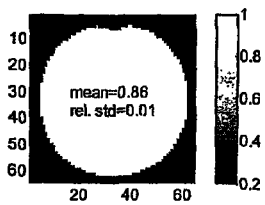
Figure 4D:
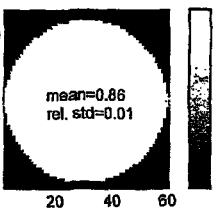
Figure 4F:
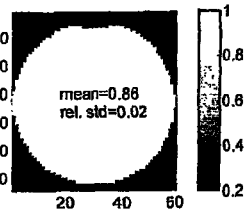

FIGS. 4A, 4C and 4B show axial, coronal and sagittal sections of the spatial sin(FA) distribution in the same sample body used for realizing FIGS. 3A and 3B, when a "standard" rectangular pulse, calibrated by the scanner, is used. The sine of the flip angle is used instead of the angle itself, because it is more directly related to the MRI image brightness. The overall relative standard deviation of sin(FA) is about 16% of the mean value. FIGS. 4B, 4D and 4E show the same sections of the spatial FA distribution obtained by exciting the spins by an "optimal" composite pulse computed according to the method of the invention. This optimal pulse is composed by N=3 elementary pulses and has a duration of 2.2 ms. Its time-varying amplitude and phase are shown on FIGS. 1A and 1B. Thanks to the use of an optimized pulse, the relative standard deviation of sin(FA) decreases from 16% to 1% for a nominal FA of 60°. Calculations yield a theoretical standard deviation of 0.3%. The discrepancy between theory and experiment can be explained by: the finite number of histogram bins (here 20), the finite accuracy of the initial $B_1$ measurement due to intrinsic noise, the imperfect scanner calibration and possible nonlinearities in the amplifying electronic chain Besides the much larger uniformity in the excitation, it is worth also noticing the considerable improvement of the achieved FA. A theoretical flip angle of 60° corresponds to an image intensity equal to $3^{1/2}/2 \cong 0.866$. Over the whole volume, the mean of the sine of the FA is measured to be 0.862 with the invention presented here, compared to 0.770 for the rectangular pulse. This is closer to the target value by a factor of (0.866-0.770)/(0.866-0.862)=24.

Figure 5:
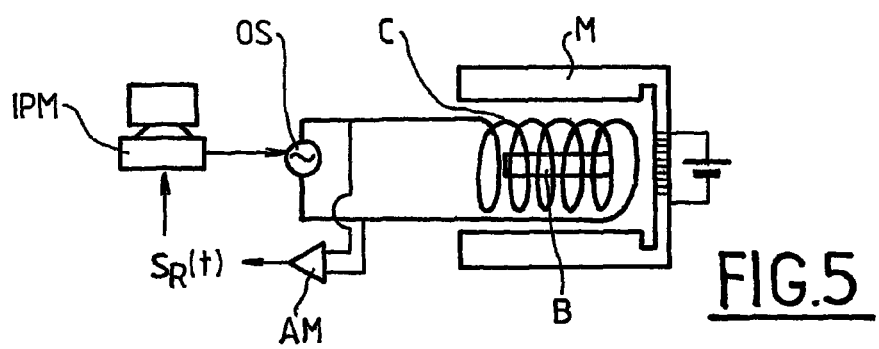
FIG. 5, a magnetic resonance imaging scanner according to an embodiment of the invention.

A particularly advantageous feature of the method of the invention is that it can be carried out by a conventional scanner provided with suitable information processing means. Such a conventional scanner is schematically represented on FIG. 5. It comprises: a magnet M for generating a static magnetic field $B_0$ in which is immersed a body B to be imaged; a coil C for irradiating said body by a transverse radio-frequency pulsed field $B_1$ and for detecting signal emitted by flipped nuclear spins within said body; electronic means (an oscillator) OS for generating the radio-frequency pulsed field and an amplifier AM for amplifying said spin resonance signal before digitizing it, and information processing means IPM. The information processing means IPM receive and process the amplified resonance signal $S_R(t)$ and, most importantly, controls the oscillator OS, determining the shape, energy, phase and frequency of the RF-pulse. A scanner according to the present invention is characterized in that said information processing means IPM are adapted for carrying out a method as described above. Since the information processing means IPM are usually based on a programmable computer, software means can turn a standard scanner into a device according to the invention, without any need for hardware modifications.

The invention claimed is:

1. A method of performing nuclear magnetic resonance imaging of a body (B), comprising: immerging said body in a static magnetic field for aligning nuclear spins along a magnetization axis; exposing it to a transverse radio-frequency pulsed field for flipping said nuclear spins by a predetermined angle; detecting a signal emitted by flipped nuclear spins; and reconstructing a magnetic resonance image of said body on the basis of the detected signal; the method being characterized in that it comprises the steps of:
   (i) determining a statistical distribution of the amplitude of said radio-frequency pulsed field within a volume of said body; and
   (ii) computing a set of optimal parameters of a composite radio-frequency pulsed field for jointly minimizing a statistical dispersion of the spin flip angles (FA) distribution within said volume of the body, and the errors between the actual spin flip angles and a predetermined target value thereof, wherein
   said radio-frequency pulsed field consists of a train of elementary radio-frequency pulses having a constant frequency and amplitude, and a continuous phase; and
   said parameters comprise: the number N of said elementary pulses, as well as the duration ($\tau_1$, $\tau_2$, $\tau_3$), amplitude ($A_1$, $A_2$, $A_3$), frequency ($\omega_1$, $\omega_2$, $\omega_3$) and initial phase ($\phi_1$, $\phi_2$, $\phi_3$) of each of them, and (iii) applying the computed set of optimal parameters to said composite radio-frequency pulsed field.

2. A method according to claim 1, wherein said step (i) of determining a statistical distribution of the amplitude of said radio-frequency pulsed field within a volume of said body comprises constructing an histogram of the values taken by the amplitude of said radio-frequency pulsed field within said volume of the body.

3. A method according to claim 1, further comprising a step (i') of determining a statistical distribution of the amplitude of said static magnetic field along said magnetization axis within said volume of the body, and wherein said step (ii) of computing a set of optimal parameters of said composite radio-frequency pulsed field is performed by taking into account said statistical distribution of the amplitude of said static magnetic field.

4. A method according to claim 3, wherein said step (i) of determining a statistical distribution of the amplitude of said radio-frequency pulsed field within a volume of said body comprises constructing a bi-dimensional histogram of the values taken by the amplitude of said radio-frequency pulsed field and of said static magnetic field along said magnetization axis within said volume of the body.

5. A method according to claim 1, wherein said step (ii) of computing a set of optimal parameters of said composite radio-frequency pulsed field comprises:
(ii$_a$) predetermining a minimal number of elementary pulses;
(ii$_b$) computing optimal values for the durations, amplitudes, frequencies and relative initial phases of said elementary pulses, and evaluating the corresponding dispersion of the spin flip angles distribution and errors between the actual spin flip angles and their predetermined target value;
(ii$_c$) if at least one between the dispersion of the spin-flip angles distribution within said volume of the body, and the errors between the actual spin-flip angles and their predetermined target value, exceeds a predetermined threshold, and if the number of elementary pulses is less than a predetermined maximum, increasing said number of elementary pulses and repeating sub-steps (ii$_b$) and (ii$_c$).

6. A method according to claim 1, wherein said step (ii) of computing a set of optimal parameters of said composite radio-frequency pulsed field is performed by taking into account a penalty function depending on at least one of: the duration of the composite radio-frequency pulsed field, its peak power, its energy, its maximum frequency and its specific absorption rate.

7. A method according to claim 1, wherein said step (ii) of computing a set of optimal parameters of said composite radio-frequency pulsed field is implemented by using a genetic algorithm combined with a direct search method.

8. A method according to claim 1, wherein said step (i) of determining a statistical distribution of the amplitude of said radio-frequency pulsed field within a volume of said body comprises:
(i$_a$) measuring the dispersion of the spin flip angles distribution within said volume of the body; and
(i$_b$) deducing a statistical distribution of the amplitude of said radio-frequency pulsed field.

9. A magnetic resonance imaging scanner comprising:
a magnet for generating a static magnetic field for aligning nuclear spins of a body to be imaged along a magnetization axis;
means for generating a transverse radio-frequency pulsed field, and for directing said radio-frequency pulsed field toward said body in order to flip said nuclear spins by a predetermined angle; and
means for detecting a signal emitted by flipped nuclear spins within said body;
characterized in that said means for generating a radio-frequency pulsed field comprise computing means for carrying out the steps of:
(i) determining a statistical distribution of the amplitude of said radio-frequency pulsed field within a volume of said body; and
(ii) computing a set of optimal parameters of a composite radio-frequency pulsed field for jointly minimizing a statistical dispersion of the spin flip angles (FA) distribution within said volume of the body, and the errors between the actual spin flip angles and a predetermined target value thereof, wherein
said radio-frequency pulsed field consists of a train of elementary radio-frequency pulses having a constant frequency and amplitude, and a continuous phase; and
said parameters comprise: the number N of said elementary pulses, as well as the duration ($\tau_1, \tau_2, \tau_3$), amplitude ($A_1, A_2, A_3$), frequency ($\omega_1, \omega_2, \omega_3$) and initial phase ($\phi_1, \phi_2, \phi_3$) of each of them, and
(iii) applying the computed set of optimal parameters to said composite radio-frequency pulsed field.

* * * * *